United States Patent
Jeong et al.

(10) Patent No.: US 7,906,841 B2
(45) Date of Patent: Mar. 15, 2011

(54) WAFER LEVEL INCAPSULATION CHIP AND ENCAPSULATION CHIP MANUFACTURING METHOD

(75) Inventors: Byung-gil Jeong, Anyang-si (KR); In-sang Song, Seoul (KR); Woon-bae Kim, Suwon-si (KR); Min-seog Choi, Seoul (KR); Suk-jin Ham, Seoul (KR); Ji-hyuk Lim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 246 days.

(21) Appl. No.: 11/447,971

(22) Filed: Jun. 7, 2006

(65) Prior Publication Data

US 2007/0020817 A1   Jan. 25, 2007

(30) Foreign Application Priority Data

Jul. 13, 2005  (KR) .................. 10-2005-0063439

(51) Int. Cl.
| H01L 23/48 | (2006.01) |
| H01L 23/52 | (2006.01) |
| H01L 23/04 | (2006.01) |
| H01L 21/00 | (2006.01) |

(52) U.S. Cl. ......... 257/690; 438/106; 438/124; 438/127; 438/456; 438/458; 257/684; 257/787; 257/698; 257/699; 257/708; 257/E23.016; 257/E23.012; 257/E23.031; 257/E23.067; 257/E23.116

(58) Field of Classification Search .................. 257/690
See application file for complete search history.

(56) References Cited

U.S. PATENT DOCUMENTS

| 5,604,379 | A  | * | 2/1997  | Mori .............................. 257/738 |
| 5,677,576 | A  | * | 10/1997 | Akagawa ....................... 257/785 |
| 5,886,415 | A  | * | 3/1999  | Akagawa ....................... 257/789 |
| 6,121,688 | A  | * | 9/2000  | Akagawa ....................... 257/778 |
| 6,437,432 | B2 | * | 8/2002  | Ikumo et al. .................. 257/691 |
| 6,538,315 | B2 | * | 3/2003  | Bessho et al. ................. 257/698 |
| 6,852,616 | B2 | * | 2/2005  | Sahara et al. ................. 438/613 |
| 7,061,099 | B2 |   | 6/2006  | Lu et al. ........................ 257/704 |
| 7,285,867 | B2 | * | 10/2007 | Matsuzaki et al. ............ 257/787 |
| 7,449,366 | B2 | * | 11/2008 | Lee et al. ...................... 438/115 |
| 2003/0213981 | A1 | * | 11/2003 | Hashimoto ................... 257/200 |
| 2007/0284755 | A1 | * | 12/2007 | Nomoto et al. ............... 257/774 |

FOREIGN PATENT DOCUMENTS

| JP | 11-251493 A | 9/1999 |
| JP | 2001-035972 A | 2/2001 |

OTHER PUBLICATIONS

Communication dated Jul. 28, 2006 issued by the Korean Intellectual Property Office in Korean Application No. 2005-63439.

* cited by examiner

*Primary Examiner* — Charles D Garber
*Assistant Examiner* — Pape Sene
(74) *Attorney, Agent, or Firm* — Sughrue Mion, PLLC

(57) ABSTRACT

A wafer level encapsulation chip and an encapsulation chip manufacturing method. The encapsulation chip includes a device substrate, a circuit module mounted on the device substrate, a bonding layer deposited on a predetermined area of the device substrate, a protection cap forming a cavity over the circuit module and bonded to the device substrate by the bonding layer and encapsulation portions formed on predetermined areas of the bonding layer and the protection cap. Thus, the present invention can minimize damages to a chip upon chip handling and prevent moisture from being introduced into the inside of the chip.

5 Claims, 5 Drawing Sheets

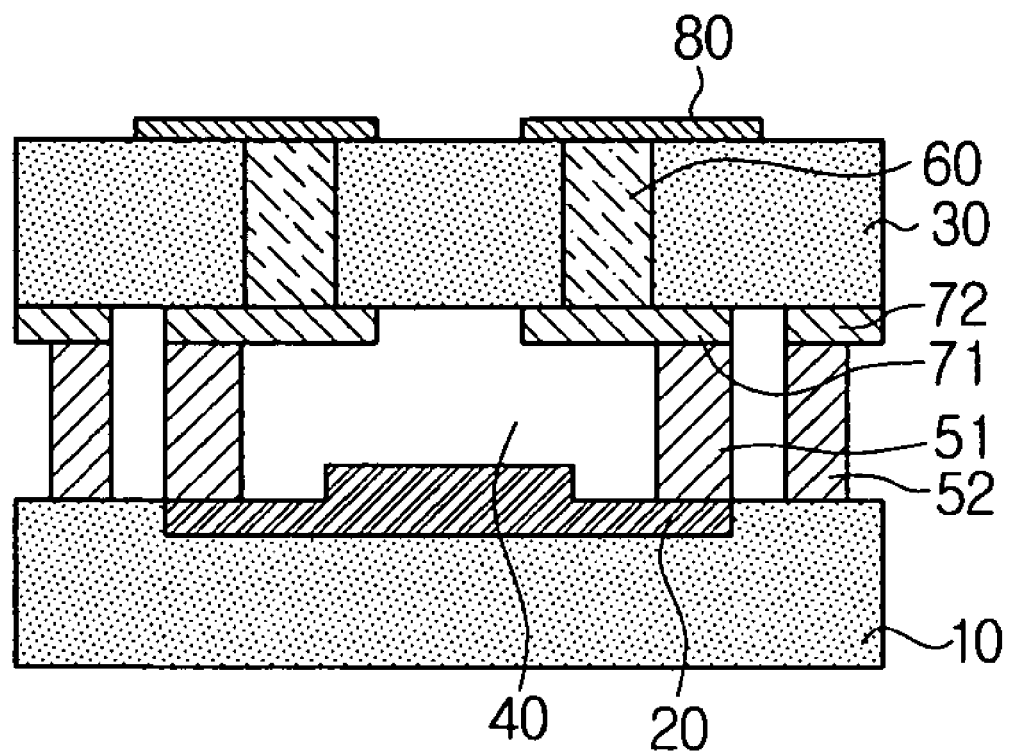

WAFER LEVEL INCAPSULATION CHIP AND ENCAPSULATION CHIP MANUFACTURING METHOD

CROSS-REFERENCE TO RELATED APPLICATIONS

This application claims the benefit under 35 U.S.C. §119 from Korean Patent Application No. 10-2005-63439, filed in the Korean Intellectual Property Office on Jul. 13, 2005, the entire disclosure of which is incorporated herein by reference.

BACKGROUND OF THE INVENTION

1. Field of the Invention

The present invention relates to a wafer level encapsulation chip and encapsulation chip manufacturing method and, more particularly, to a wafer level encapsulation chip and encapsulation chip manufacturing method capable of minimizing damages to a chip and preventing introduction of moisture into the inside of the chip upon chip handling by encapsulation through passivation on predetermined areas over the wafer-level packaging chip and predetermined areas of sides of the packaging chip.

2. Description of the Related Art

The electronic packaging chip widely used in various electronic products can be easily damaged due to external shocks since it has a minute electronic circuit therein. Thus, in the packaging chip manufacturing process, the packaging process is accompanied by hermetical sealing for overcoming external shocks and for formation of physical functions and a shape.

In particular, wafer-level packaging is necessary to meet the trend of recent electronic products such as compactness, high-performance, and so on. In general, a protection cap is bonded in a certain shape for wafer-level packaging (WLP) to a wafer with a circuit module mounted.

Meanwhile, the packaging chip is externally supplied with a signal and performs a specific operation. Thus, the packaging is required in a form enabling the external signal to be inputted to the inside of an electronic circuit.

FIG. 1 is a vertical cross-sectional view for showing a structure of a conventional packaging chip by wafer-level dicing.

In FIG. 1, the conventional packaging chip has a device substrate 10, a circuit module 20, a protection cap 30, a cavity 40, a connection layer 51, a bonding layer 52, vias 60, a connection pad 71, a bonding pad 72, and electrodes 80.

The device substrate 10 is formed of a semiconductor wafer on which a circuit module 20 is mounted. The circuit module 20 comprises a RF circuit module with a filter function.

The protection cap 30 is a wafer for protecting the circuit module 20. The cavity 40 is an empty space formed between the device substrate 10 and the protection cap 30 to accommodate the circuit module 20. Thus, the bonding pad 72 and the bonding layer 52 bond the protection cap 30 and the device substrate 10 in order for the circuit module 20 to be located inside the cavity 40.

The vias 60 are formed through the protection cap 30 so that an external signal and the circuit module 20 are electrically connected.

The connection pad 71 deposited below the vias 60 is connected to the connection layer 51. The electrodes 80 are electrically connected to the vias 60 on the upper surface of the protection cap 30.

Thus, an externally applied electric signal is sent to the internal circuit module 20 through the electrodes 80, the vias 60, the connection pad 71, and the connection layer 51.

FIGS. 2A to 2B are vertical cross-sectioned views for explaining a conventional dicing process.

FIG. 2A is a vertical cross-sectional view for showing two bonded wafers, that is, an lower wafer for the device substrate 10 and a upper wafer for the protection cap 30, prior to dicing.

The dotted lines in FIG. 2A indicate an area for dicing. FIG. 2B is a vertical cross-sectional view for showing a final packaging chip after the full dicing along the dotted lines shown in FIG. 2A.

The conventional dicing method vertically cuts a packaging chip by a dicing saw fully dicing at a time.

In general, the protection cap 30 is grabbed when the packaging chip is handled. Since the chip has a poor durability, there is a problem of damages to the chip due to a chipping phenomenon when the chip is handled.

Since there exists a thermal expansion coefficient difference between the vias 60 and the protection cap 30, there occurs a gap between the vias 60 and the electrodes 80. Moisture is introduced through the gap. Further, moisture is introduced into a gap between the bonding layer 52 and the bonding pad 72 and a gap between the bonding layer 52 and the device substrate 10 on sides of the packaging chip. Thus, there exists a problem of degrading a function of the circuit inside the chip.

SUMMARY OF THE INVENTION

One aspect of the present invention is to solve the above drawbacks and other problems associated with the conventional arrangement. Another aspect of the present invention is to provide a wafer level encapsulation chip and an encapsulation chip manufacturing method, capable of minimizing damages to a chip upon chip handling and preventing moisture from being introducing into the inside of the chip by encapsulation through passivation on certain areas over a wafer-level packaging chip and on certain areas on sides of the packaging chip.

The foregoing and other aspects and advantages are substantially realized by providing an encapsulation chip, comprising a device substrate; a circuit module mounted on the device substrate; a bonding layer deposited on a predetermined area of the device substrate; a protection cap forming a cavity over the circuit module and bonded to the device substrate by the bonding layer; and encapsulation portions formed on predetermined areas of the bonding layer and the protection cap.

The protection cap includes at least one or more vias passing through the protection cap; a connection pad connecting the vias with the circuit module; and at least one or more electrodes electrically connected to the vias over a upper surface of the protection cap.

The encapsulation portions may be formed by passivation on areas except on predetermined areas of the electrodes.

The encapsulation portions may be formed of any of polymer and metal.

The foregoing and other aspects and advantages are substantially realized by providing an encapsulation chip manufacturing method, comprising steps of (a) bonding a protection cap to a device substrate having a predetermined circuit module thereon; (b) bevel-cutting predetermined areas on the protection cap; (c) passivating on the bevel-cut portions; and (d) separating the passivated portions into plural chips by full dicing.

The device substrate may be cut to a predetermined depth in the bevel-cutting step (b).

Meanwhile, the encapsulation chip manufacturing method further comprises a step of forming electrodes over an upper surface of the protection cap and electrically connected to the circuit module.

Areas except the predetermined areas of the electrodes may be passivation-treated in the step (c).

The passivation may be formed with any of polymer and metal in the step (c).

A spin coating process may be used for the passivation in the step (c).

BRIEF DESCRIPTION OF THE DRAWINGS

The above aspects and features of the present invention will be more apparent by describing certain exemplary embodiments of the present invention with reference to the accompanying drawings, in which:

FIG. 1 is a vertical cross-sectional view for showing a structure of a conventional packaging chip by wafer-level dicing;

DESCRIPTION OF THE EXEMPLARY EMBODIMENT

Hereinafter, exemplary embodiments of the present invention will be described in detail with reference to the accompanying drawings. The described exemplary embodiments are intended to assist the understanding of the invention, and are not intended to limit the scope of the invention in any way.

Figure 2A:
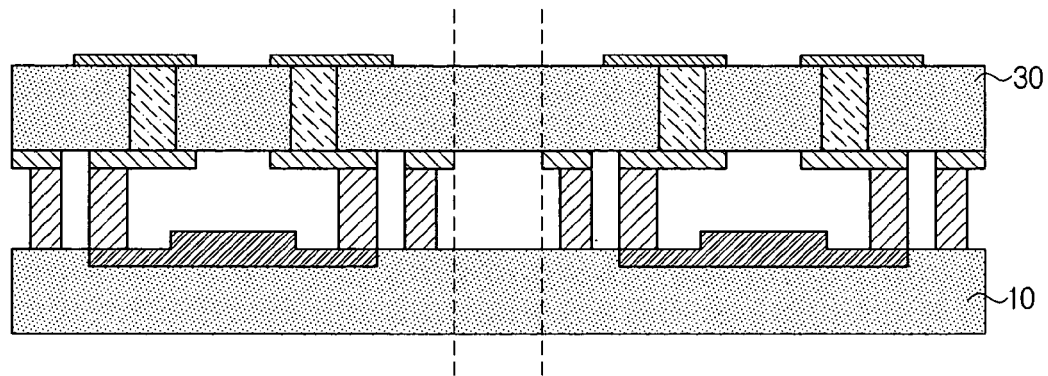
FIG. 2A to FIG. 2B are vertical cross-sectional views for explaining a conventional dicing process.
Figure 2B:
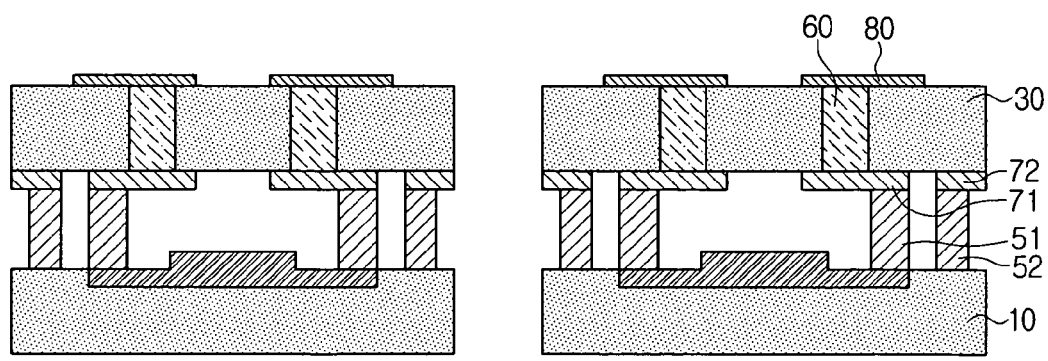
Figure 3:
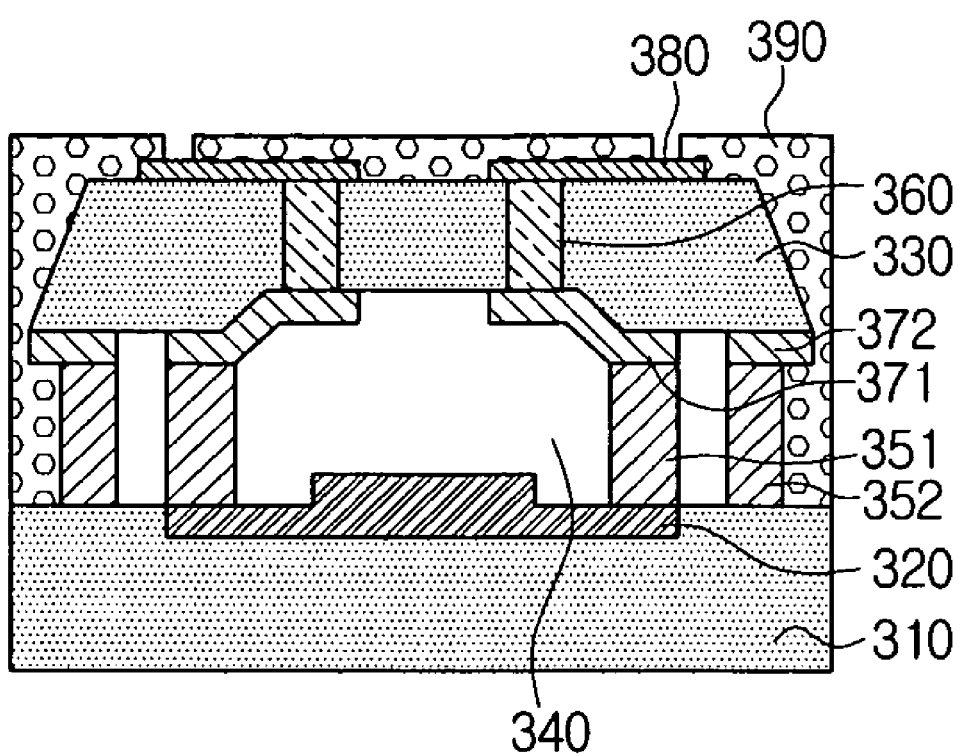
FIG. 3 is a vertical cross-sectional view for showing a structure of an encapsulation chip according to an exemplary embodiment of the present invention.

FIG. 3 is a vertical cross-sectioned view for showing a structure of an encapsulation chip according to an exemplary embodiment of the present invention.

In FIG. 3, the encapsulation chip has a device substrate 310, a circuit module 320, a protection cap 330, a cavity 340, a connection layer 351, a bonding layer 352, vias 360, a connection pad 371, a bonding pad 372, electrodes 380, and encapsulation portions 390.

The device substrate 310 is made of semiconductor wafer, on which the circuit module 320 is mounted. The circuit module 320 can be a circuit provided with a certain function, and can be an RF circuit module having a general filter function. The circuit module 320 can be formed in the top surface of the device substrate 310, or embedded in the device substrate 310 if the device substrate 310 is a printed circuit board (PCB).

The protection cap 330 is a wafer for protecting the circuit module 320. The silicon wafer being a general semiconductor wafer can be used as the protection cap 330. A part of lower surface of the protection cap 330 is etched. Accordingly, as the protection cap 330 and the device substrate 310 are bonded to each other, a cavity 340 is formed between the protection cap 330 and the device substrate 310. Therefore, the circuit module 320 can be located inside the cavity 340.

The connection pad 371 and the bonding pad 372 are formed on the lower surface of the protection cap 330. At this time, the connection pad 371 is extended to the etched region of the lower surface of the protection cap 330 so that it is connected with the vias 360. The vias 360 connect the inside of the etched region with a top surface of the protection cap 330. The connection pad 371 also serves as a seed layer to coat the vias 360.

The bonding layer 352 is deposited on the top surface of the device substrate 310. The bonding layer 352 is bonded with the bonding pad 372 to bond the protection cap 330 and the device substrate 310. The connection layer 351 connects the connection pad 371 and the circuit module 320. The connection layer 351 and the bonding layer 352 may be made of solder. The solder can be an alloy of Au and Zn or the like.

The vias 360 penetrate at least one or more protection caps 330, and are generally formed with copper filled therein. The vias 360 are formed to connect external signal terminals to the circuit module 320.

The electrodes 380 are electrically connected to the vias 360 over the upper surface of the protection cap 330, and input and output external signals from and to the circuit module 320 through the vias 360.

Thus, an externally applied electric signal such as an RF signal is sent to the internal circuit module 320 through the electrodes 380, the vias 360, and the connection pad 371.

Meanwhile, the encapsulation portions 390 are predetermined passivation areas including the vias 360 and predetermined passivation areas of the sides of a package chip without passivation to a part of the electrode 380 of the top surface of Wafer Level micro Packaging (WLμP) chip.

The sides of a passivation-treated encapsulation chip can be used for chip handling so that the chip can be prevented from being damaged, and moisture or foreign materials can be prevented from being introduced into gaps over the vias 360 and gaps by the sides of the chip.

FIGS. 4A to 4D are vertical cross-sectional views for explaining an encapsulation chip manufacturing method through a dicing process according to an exemplary embodiment of the present invention.

Figure 4A:
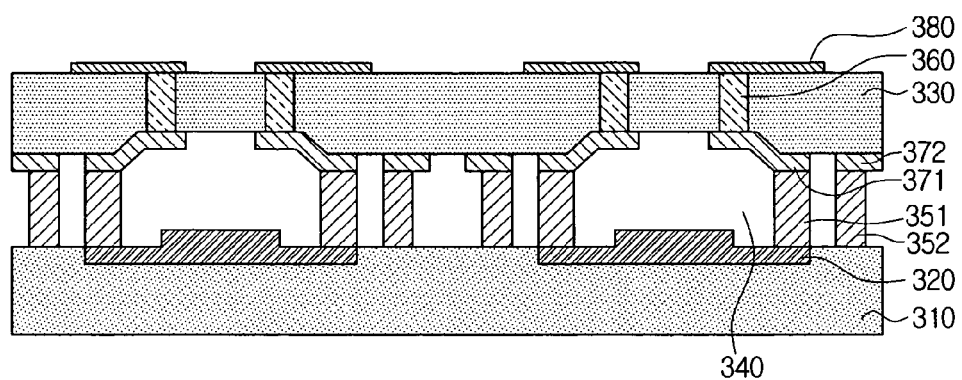
FIGS. 4A to 4D are vertical cross-sectional views for explaining an encapsulation chip manufacturing method through a dicing process according to an exemplary embodiment of the present invention.

FIG. 4A is a vertical cross-sectional view for showing two bonded wafers, that is, the device substrate 310 being a lower wafer and the protection cap 330 being an upper wafer. For formation of the two bonded wafers shown in FIG. 4A, first, a predetermined area on the lower surface of the protection cap 330 is etched away for formation of the cavity 340. The etching process can be omitted. Next, the metal layer is deposited over the entire lower surface of the protection cap 330 and patterned to form the connection pad 371 and the bonding pad 372.

Next, the protection cap 330 is bonded to the device substrate 310. To this end, the connection layer 351 and the bonding layer 350 is first formed on the device substrate 310.

Further, the circuit module 320 is mounted or deposited in advance over the device substrate 310. As stated above, the circuit module 320 can be built in the device substrate 310 if the device substrate 310 is a PCB.

Next, at least one or more vias 360 are formed by the photoresist coating used for the semiconductor process. The vias 360 can be formed through the reactive Ion etching (RIE) process.

The vias 360 go through the protection cap 330 so that the connection pad 371 below the protection cap 330 is exposed. Here, the number of the vias 360 can be arbitrarily set depending on the number of electrodes (not shown) of the circuit module 320 for packaging. Meanwhile, if the vias 360 are formed penetrating to the inside of the cavity 340, the chip size may be reduced.

Next, the inside of the vias is coated using the connection pad 371 on the lower surface of the protection cap 330 as a seed layer.

Next, the electrodes 380 are formed connected to the vias 360. The electrodes 380 are formed in a manner that a metal substance are deposited on the upper surface of the protection cap 330 and patterned.

Figure 4B:
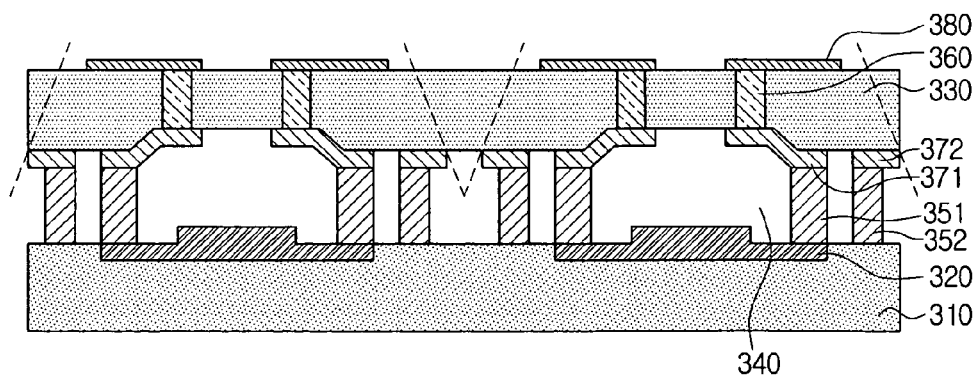

FIG. 4B is a vertical cross-sectioned view for showing in dotted lines bevel-cut portions of two bonded wafers in package as shown in FIG. 4A. The bevel cuts are carried out by a dicing saw shaped in a letter "V." The bevel cuts are carried out to a certain depth of the device substrate 310.

Figure 4C:
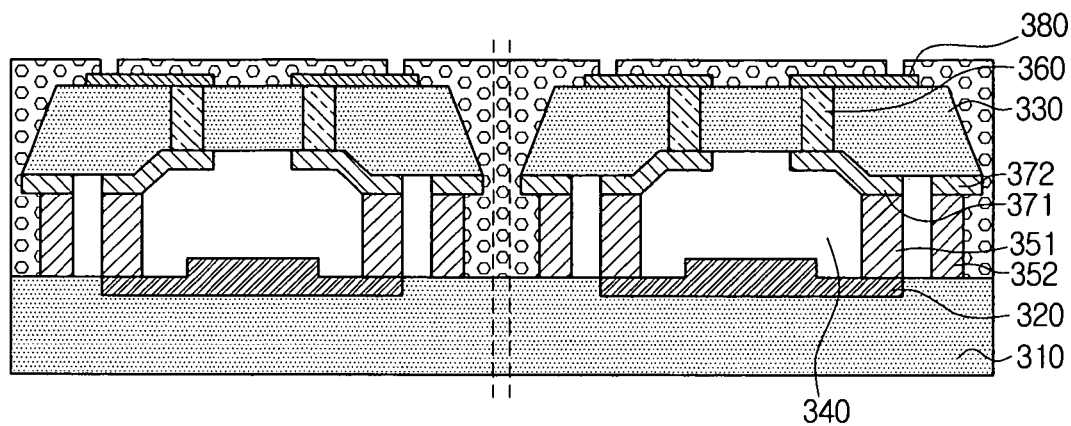

FIG. 4C is a vertical cross-sectional view for showing passivation on the bevel-cut portions shown in FIG. 4B. While the electrodes 380 remain patterned, the chip is passivated with polymer or metal.

The polymer can be Benzocyclobutene (BCB). The metal can be Cu, Au, or the like. A spin coating process can be used as the passivation process. The dotted lines of FIG. 4C denote portions for full dicing.

Figure 4D:
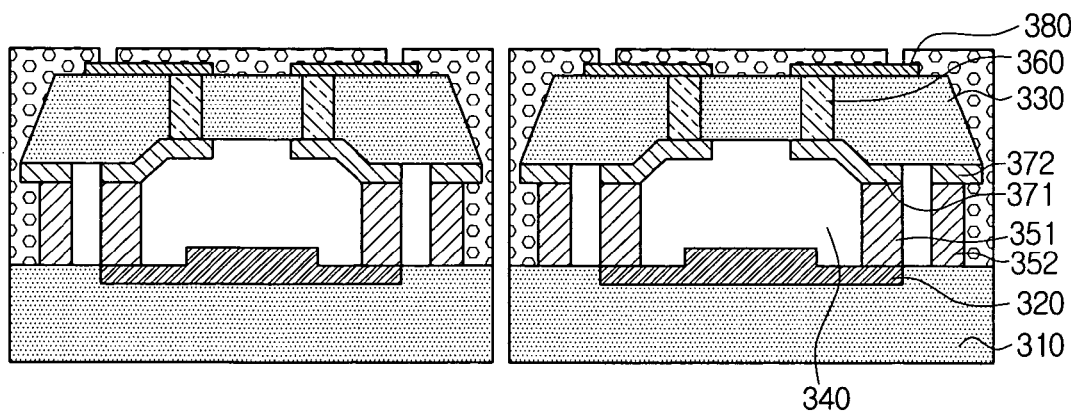

FIG. 4D is a vertical cross-sectional view for showing an encapsulated chip after the full dicing of edge portions of the chip. Thus, the chipping of chip breakage can be prevented since the passivation-treated side portions of a chip can be held for chip handling.

Further, it can prevent moisture from being introduced through gaps occurring around the electrodes 380 over the upper surface of the vias 360 due to a thermal expansion coefficient difference between the vias 360 and the protection cap 330. Thus, the encapsulation on the upper portion and sides of the packaging chip minimizes the influence of a moisture factor under reliability environment.

As aforementioned, since the exemplary embodiment of the present invention encapsulates on predetermined areas of the upper portion of a packaging chip and predetermined areas of the sides of the packaging chip, the present invention can minimize damages to chips upon chip handling and prevent moisture from being introduced into the inside of the chip.

Further, the foregoing exemplary embodiments and advantages are merely exemplary and are not to be construed as limiting the present invention. The present teaching can be readily applied to other types of apparatuses. Also, the description of the exemplary embodiments of the present invention is intended to be illustrative, and not to limit the scope of the claims, and many alternatives, modifications, and variations will be apparent to those skilled in the art.

What is claimed is:

1. An encapsulation chip, comprising:
   a device substrate;
   a circuit module mounted on the device substrate;
   a bonding layer deposited on a predetermined area of the device substrate;
   a protection cap forming a cavity over the circuit module and bonded to the device substrate by the bonding layer;
   a connection pad formed on a lower surface of the protection cap and connected with one or more vias passing through the protection cap, the connection pad extending to a recessed region of the protection cap; and
   encapsulation portions passivated connectively using a same material on an upper area and a side area of the protection cap and a side area of the bonding layer,
   wherein the protection cap comprises:
      a first beveled peripheral edge;
      a second beveled peripheral edge;
      one or more vias passing through the protection cap; and
      one or more electrodes electrically connected to the one or more vias over an upper surface of the protection cap, and
   wherein the encapsulation portions are passivated on the one or more vias and a part of the one or more electrodes without passivation to another part of the one or more electrodes,
   wherein the encapsulation portions are formed by spreading the same material at one time on the upper area and the side area of the protection cap and the side area of the bonding layer, and
   wherein the encapsulation portions are configured to prevent moisture from entering through gaps between the vias and the electrodes due to a thermal expansion coefficient difference between the vias and the electrodes.

2. The encapsulation chip as claimed in claim 1, wherein the connection pad connects the vias with the circuit module.

3. The encapsulation chip as claimed in claim 2, wherein the encapsulation portions are formed by passivation on predetermined passivation areas which do not include at least a portion of a surface of the electrodes.

4. The encapsulation chip as claimed in claim 1, wherein the encapsulation portions are formed of at least one of a polymer and a metal.

5. The encapsulation chip as claimed in claim 1, wherein the encapsulation portions are formed above predetermined areas of the bonding layer and the protection cap.

* * * * *